(12) United States Patent
Chen

(10) Patent No.: US 10,792,696 B2
(45) Date of Patent: Oct. 6, 2020

(54) DOCTOR-BAR ADJUSTING MECHANISM FOR COATER AND COATER

(71) Applicant: Wuhan China Star Optoelectronics Technology Co., Ltd., Wuhan, Hubei (CN)

(72) Inventor: Xuefa Chen, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 390 days.

(21) Appl. No.: 15/743,328

(22) PCT Filed: Oct. 30, 2017

(86) PCT No.: PCT/CN2017/108317
§ 371 (c)(1),
(2) Date: Jan. 10, 2018

(87) PCT Pub. No.: WO2019/080143
PCT Pub. Date: May 2, 2019

(65) Prior Publication Data
US 2020/0130010 A1    Apr. 30, 2020

(30) Foreign Application Priority Data
Oct. 25, 2017  (CN) .......................... 2017 1 1008425

(51) Int. Cl.
*B05C 11/04*  (2006.01)
*G03F 7/16*  (2006.01)
(Continued)

(52) U.S. Cl.
CPC .......... *B05C 11/042* (2013.01); *B05C 11/023* (2013.01); *B05C 11/044* (2013.01); *G03F 7/16* (2013.01); *B41F 9/1036* (2013.01)

(58) Field of Classification Search
CPC ... B05C 11/042; B05C 11/044; B05C 11/041; B05C 11/023; D21H 25/10; D21G 3/00;
(Continued)

(56) References Cited

U.S. PATENT DOCUMENTS 3,152,918 A * 10/1964 Kraus .................... D12H 25/10
                                                                  427/358
5,279,710 A *  1/1994 Aikawa .................. D21G 3/005
                                                                  15/256.51
5,284,516 A    2/1994 Sieberth

* cited by examiner

*Primary Examiner* — Laura Edwards
(74) *Attorney, Agent, or Firm* — Hemisphere Law, PLLC; Zhigang Ma

(57) ABSTRACT

The embodiments of the disclosure disclose a doctor-bar adjusting mechanism for a coater, including: a base bracket, an upper plate and a lower plate secured to the base bracket at two ends thereof, a side of a doctor-bar sandwiched between the upper plate and the lower plate, and an other side of the doctor-bar close to a surface of a roller of the coater; the upper plate further comprising an adjusting plate on an upper side thereof, the adjusting plate secured to the base bracket at ends thereof and including a plurality of adjusting devices thereon adapted for adjusting a spacing between the adjusting plate and the upper plate. The implementation of the embodiments of the disclosure may adjust conveniently a spacing between the doctor-bar and the roller and improve the maintenance efficiency and productivity of the coater.

6 Claims, 2 Drawing Sheets

(51) Int. Cl.
 *B05C 11/02* (2006.01)
 *B41F 9/10* (2006.01)
(58) Field of Classification Search
 CPC ... D21G 3/005; G03F 7/16; B41F 9/10; B41F 9/1036; B41F 9/1072
 USPC .................. 118/126, 304, 100; 15/256.51
 See application file for complete search history.

DOCTOR-BAR ADJUSTING MECHANISM FOR COATER AND COATER

RELATED APPLICATIONS

The present application is a National Phase of International Application Number PCT/CN2017/108317, filed Oct. 30, 2017, and claims the priority of China Application No. 201711008425.7, filed Oct. 25, 2017.

FIELD OF THE DISCLOSURE

The disclosure relates to the field of a display, and particularly to a doctor-bar adjusting mechanism for a coater and a coater.

PRIOT ART

Currently, a liquid crystal display device as a display element for an electronic device is widely used in various electronic products. Coating and developing process is an important part in defining microelectronic circuit pattern during producing liquid crystal display devices. With regard to a photoresist linear coating device, it is required to scrape off the excess photoresist sprayed on the surface of a roller by using a blade during the actual producing process. However, during the actual process, the bonding between a doctor-bar and the roller may become poor with the extended usage time, thereby producing LC dummy roller bright line on the liquid crystal and resulting in an abnormality of uneven lights in liquid crystal products. If such problem is occurred, it is necessary to adjust the position of the doctor-bar or replace the doctor-bar. However, it takes much time and effort to adjust the position of the doctor-bar or replace the doctor-bar in the prior art.

SUMMARY

A technical problem to be solved by the disclosure is to provide a doctor-bar adjusting mechanism for a coater and a coater, which can adjust conveniently a distance between a doctor-bar and a roller and improve the maintenance efficiency and productivity of the coater.

In order to solve the above technical problem, an aspect of an embodiment of the disclosure provides a doctor-bar adjusting mechanism for a coater, including:

a base bracket, an upper plate and a lower plate secured to the base bracket at two ends thereof, a side of a doctor-bar sandwiched between the upper plate and the lower plate, and an other side of the doctor-bar close to a surface of a roller of the coater; and the upper plate further including an adjusting plate on an upper side thereof, the adjusting plate secured to the base bracket at two ends thereof and including a plurality of adjusting devices thereon adapted for adjusting a spacing between the adjusting plate and the upper plate.

Wherein the adjusting plate is a metal plate, the adjusting devices are adjusting bolts disposed penetratingly on the adjusting plate and a top end of the adjusting bolts are against a surface of the upper side of the upper plate.

Wherein the base bracket at least comprises two parallel vertical plates, and the upper plate, the lower plate and the adjusting plate are disposed between the two vertical plates and secured to inner sides of the two vertical plates, respectively.

Correspondingly, an embodiment of the disclosure also includes a coater at least including a coating liquid dispenser having a nozzle, a roller and a doctor-bar, and further including a doctor-bar adjusting mechanism including:

a base bracket, an upper plate and a lower plate secured to the base bracket at two ends thereof, a side of the doctor-bar sandwiched between the upper plate and the lower plate, and an other side of the doctor-bar close to a surface of a roller of the coater; and the upper plate further including an adjusting plate on an upper side thereof, the adjusting plate secured to the base bracket at two ends thereof and comprising a plurality of adjusting devices thereon adapted for adjusting a spacing between the adjusting plate and the upper plate.

Wherein the adjusting plate is a metal plate, the adjusting device are adjusting bolts disposed penetratingly on the adjusting plate and a top end of the adjusting bolts are against a surface of the upper side of the upper plate.

Wherein the base bracket at least comprises two parallel vertical plates, and the upper plate, the lower plate and the adjusting plate are disposed between the two vertical plates and secured to inner sides of the two vertical plates, respectively.

The implementation of the embodiments of the disclosure has the advantageous effects as follows.

According to the doctor-bar adjusting mechanism for the coater provided by the embodiments of the disclosure, the adjusting plate is disposed on an upper side of an upper plate of a holding plate of the doctor-bar and the adjusting bolts are used to adjust a spacing between the adjusting plate and the upper plate, so as to control a spacing between the doctor-bar and the roller, eliminate the need to reinstall or replace the doctor-bar frequently and reduce the time for abnormality elimination, thereby improving the maintenance efficiency and productivity of a coater and prolonging the service life of a doctor-bar.

BRIEF DESCRIPTION OF THE DRAWINGS

In order to more clearly illustrate the embodiments of the disclosure or technical solutions in the prior art, a brief introduction to drawings to be used in the embodiments or the prior art description is made. Evidently, the drawings in the description below are merely some embodiments of the disclosure, and a person skilled in the art can obtain other drawings according to these drawings without paying creative labors.

DETAILED DESCRIPTION OF PREFERRED EMBODIMENTS

The technical solutions in the embodiments of the disclosure are clearly and completely described below in conjunction with the drawings in the embodiments of the disclosure. Evidently, the embodiments described are merely a part of embodiments of the disclosure, rather than all embodiments. Based on the embodiments of the disclosure, all other embodiments obtained by a person skilled in the art, without paying creative labors, fall into the claimed scope of the disclosure.

Herein, it should also be explained that there are only structures and/or processing steps closely related with the solutions according to the disclosure shown in drawings and other details slightly related with the disclosure are omitted so as not to obscure the disclosure with unnecessary details.

Figure 1:
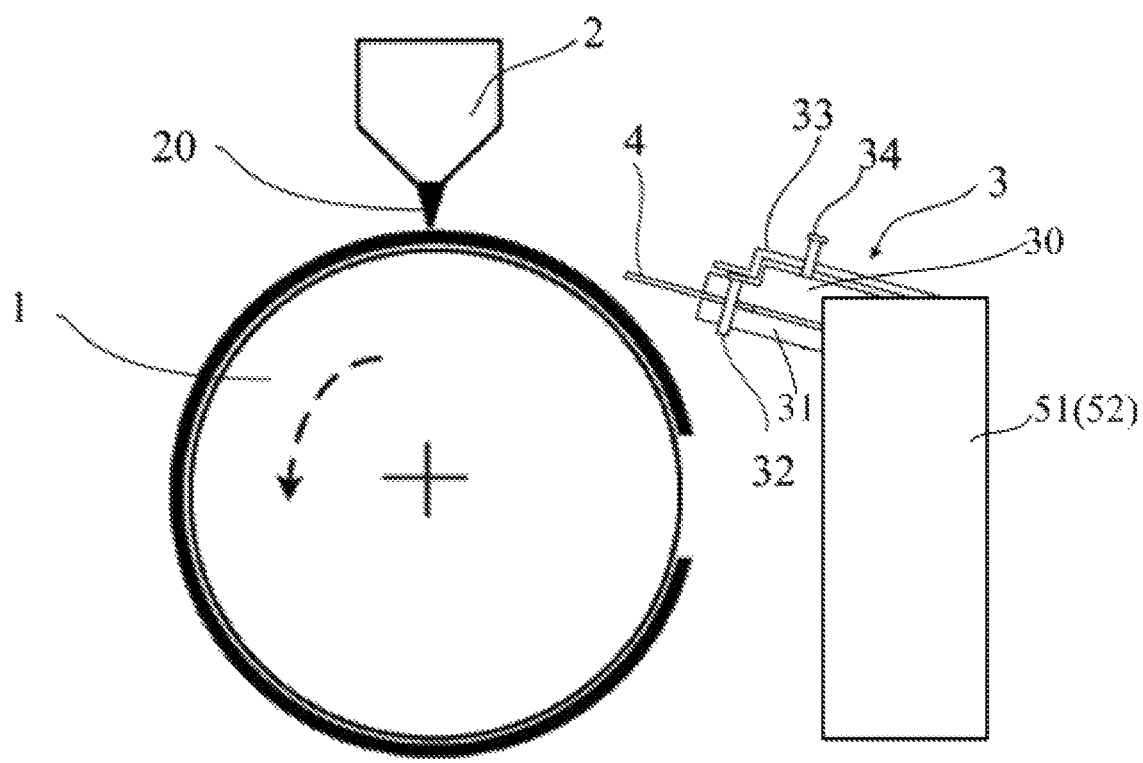
FIG. 1 is a partial structural schematic view of a coater according to the disclosure.

As shown in FIG. 1, FIG. 1 is a partial schematic view of an embodiment of a coater according to the disclosure. In the embodiment, the coater at least includes a coating liquid dispenser 2 having a nozzle 20, a roller 1 and a doctor-bar 4, and also includes a doctor-bar adjusting mechanism 3. The doctor-bar adjusting mechanism 3 includes:

a base bracket, an upper plate 30 and a lower plate 31 secured to the base bracket at two ends thereof, a side of the doctor-bar 4 sandwiched between the upper plate 30 and the lower plate 31, and an other side of the doctor-bar 4 close to a surface of a roller 1 of the coater. It should be understood that there is fixed position relation between the base bracket and the roller 1. For example, both the base bracket and the roller 1 are secured to a body structure of the coater. In an embodiment, the upper plate 30 and the lower plate 31 are secured each other via a set bolt 32.

The upper plate 30 further includes an adjusting plate 33 on an upper side thereof. The adjusting plate 33 is secured to the base bracket at two ends thereof and includes a plurality of adjusting devices 34 thereon adapted for adjusting a spacing between the adjusting plate 33 and the upper plate 30. It should be understood that, in some embodiments, the adjusting plate 33 is a metal plate, the adjusting devices 34 are adjusting bolts disposed penetratingly on the adjusting plate 33 and a top end of the adjusting bolts 34 is against a surface of the upper side of the upper plate 30.

Wherein the base bracket at least includes two parallel vertical plates 51, 52, and the upper plate 30, the lower plate 31 and the adjusting plate 33 are disposed between the two vertical plates 51, 52 and secured to inner sides of the two vertical plates 51, 52, respectively.

Figure 2:
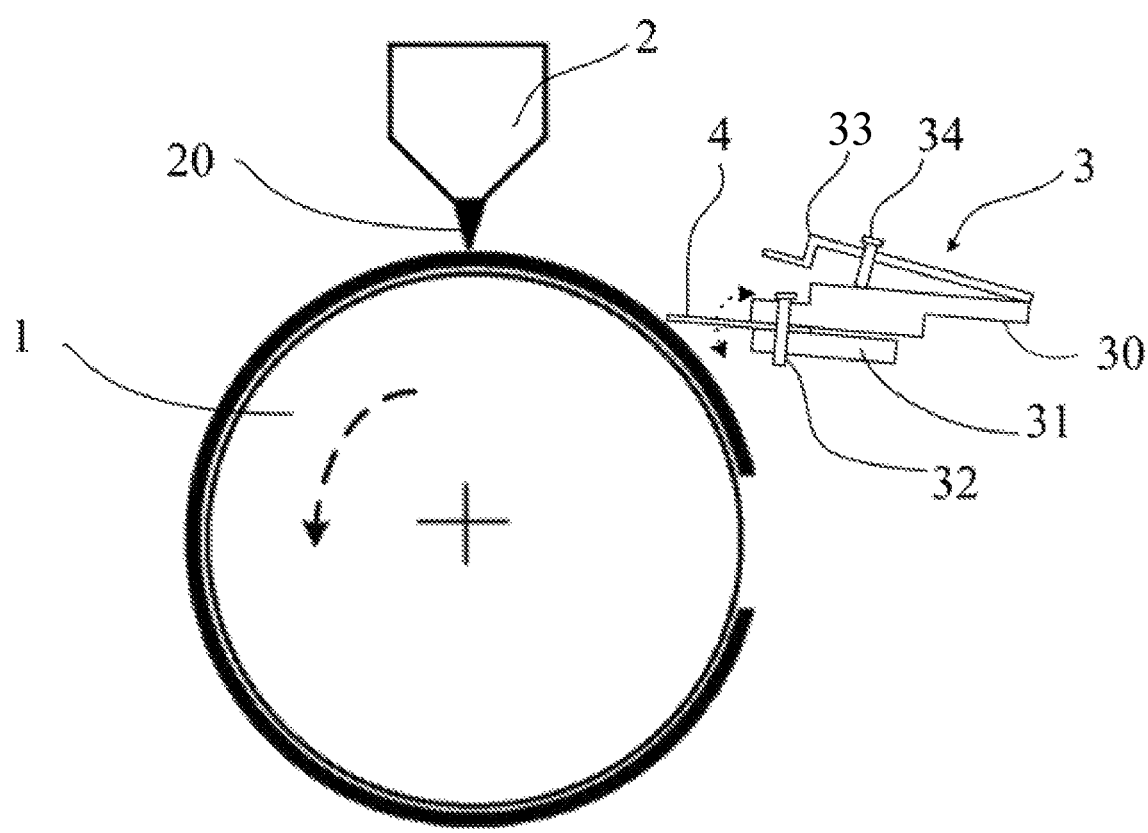
FIG. 2 is a schematic view of a doctor-bar adjusting mechanism in the coater of FIG. 1 in an adjusting condition, but the base bracket thereof is not shown.

As shown in combination with FIG. 2, when adjusting the adjusting bolts on the adjusting plate 33, the spacing between the adjusting plate 33 and the upper plate 30 may be changed. For example, when screwing in the adjusting bolts, the top of the adjusting bolts may be against the upper surface of the upper plate 30, such that the upper plate bends down and the doctor-bar 4 is more close to the surface of the roller 1. Otherwise, when loosening the adjusting bolts, the doctor-bar may be away from the surface of the roller 1.

It should be understood that FIGS. 1 and 2 only show the partial structure of the coater for ease of description. In actual embodiments, the coater should also include some structures such as a body frame, a supporting plate, a working table and a transportation track, etc., and the description thereof is omitted.

The implementation of the embodiments of the disclosure has the advantageous effects as follows.

According to the doctor-bar adjusting mechanism for the coater provided by the embodiments of the disclosure, the adjusting plate is disposed on an upper side of an upper plate of a holding plate for the doctor-bar and the adjusting bolts are used to adjust a spacing between the adjusting plate and the upper plate, so as to control a spacing between the doctor-bar and the roller, eliminate the need to reinstall or replace the doctor-bar frequently and reduce the time for abnormality elimination, thereby improving the maintenance efficiency and productivity of a coater and prolonging the service life of a doctor-bar. For example, in some circumstances, the time for abnormality elimination may be reduced from the existing one hour to several minutes.

It should be explained that the relationship terms first, second and the like herein are used for distinguishing an entity or an operation from another entity or operation and not necessarily for requiring or suggesting that there are any actual relation or order between these entities and operations. The terms "comprising", "including" or any variants thereof are intended to cover non-exclusive comprising, so that a process, a method, an article or a device including a series of elements not only includes those elements but also includes other elements inexplicitly listed, or includes elements inherently included in such process, method, article or device. Without more limitation, an element defined by the phrase "including a . . . " does not preclude that the process, method, article or device including the element also has additional the same elements.

The foregoing contents are only specific embodiments of the present application. It should be pointed out that for a person skilled in the art, several improvements and modification can be made without departing from the principle of the present application. These improvements and modification should be regarded as within the scope of protection of the present application.

What is claimed is:

1. A doctor-bar adjusting mechanism for a coater with a body frame and a supporting plate, comprising:
    a base bracket, an upper plate and a lower plate secured to the base bracket at two ends thereof, a side of a doctor-bar sandwiched between the upper plate and the lower plate, and another side of the doctor-bar close to a surface of a roller of the coater; and
    the upper plate further comprising an adjusting plate on an upper side thereof, the adjusting plate secured to the base bracket at two ends thereof and comprising a plurality of adjusting bolts thereon adapted for adjusting a spacing between the adjusting plate and the upper plate;
    wherein the upper plate and the lower plate are secured to each other via a set bolt;
    wherein the adjusting bolts are disposed penetratingly on the adjusting plate a top end of the adjusting bolts is against the upper side of the upper plate, and the set bolt is located closer to the surface of the roller than adjusting bolts;
    wherein the adjusting plate has a first end near the roller;
    wherein the adjusting bolts are configured for being screwed in to make the top end of the adjusting bolts press against the upper side of the upper plate such that the upper plate bends downwardly and the another side of the doctor-bar is more close to the surface of the roller and meanwhile the first end of the adjusting plate moves away from the set bolt, and the upper plate configured for being loosened to make the doctor-bar move away from the surface of the roller.

2. The doctor-bar adjusting mechanism according to claim 1, wherein the adjusting plate is a metal plate.

3. The doctor-bar adjusting mechanism according to claim 2, wherein the base bracket at least comprises two parallel vertical plates, and the upper plate, the lower plate and the adjusting plate are disposed between the two vertical plates and secured to inner sides of the two vertical plates, respectively.

4. A coater, comprising a body frame, and a supporting plate, a coating liquid dispenser, a roller and a doctor-bar, and further comprising a doctor-bar adjusting mechanism comprising:
    a base bracket, an upper plate and a lower plate secured to the base bracket at two ends thereof, a side of the doctor-bar sandwiched between the upper plate and the lower plate, and another side of the doctor-bar close to a surface of a roller of the coater; and the upper plate further comprising an adjusting plate on an upper side thereof, the adjusting plate secured to the base bracket at two ends thereof and comprising a plurality of adjusting bolts thereon adapt for adjusting a spacing between the adjusting plate and the upper plate;

wherein the upper plate and the lower plate are secured to each other via a set bolt;

wherein the adjusting bolts are disposed penetratingly on the adjusting plate a top end of the adjusting bolts is against the upper side of the upper plate, and the set bolt is located closer to the surface of the roller than adjusting bolts;

wherein the adjusting plate has a first end near the roller;

wherein the adjusting bolts are configured for being screwed in to make the top end of the adjusting bolts press against the upper side of the upper plate such that the upper plate bends downwardly and the another side of the doctor-bar is more close to the surface of the roller and meanwhile the first end of the adjusting plate moves away from the set bolt, and the upper plate configured for being loosened to make the doctor-bar move away from the surface of the roller.

5. The coater according to claim 4, wherein the adjusting plate is a metal plate.

6. The coater according to claim 5, wherein the base bracket at least comprises two parallel vertical plates, and the upper plate, the lower plate and the adjusting plate are disposed penetratingly between the two vertical plates and secured to inner sides of the two vertical plates, respectively.

* * * * *